United States Patent [19]

Hill

[11] 4,171,511

[45] Oct. 16, 1979

[54] AUTOMATIC FIELD-FREQUENCY LOCK IN AN NMR SPECTROMETER

[75] Inventor: Howard D. W. Hill, Cupertino, Calif.

[73] Assignee: Varian Associates, Inc., Palo Alto, Calif.

[21] Appl. No.: 896,410

[22] Filed: Apr. 14, 1978

[51] Int. Cl.[2] .................................. G01R 33/08
[52] U.S. Cl. .................................................. 324/313
[58] Field of Search ............ 324/0.5 R, 0.5 A, 0.5 AC

[56] References Cited

U.S. PATENT DOCUMENTS

| 3,725,776 | 4/1973 | Petrinovic | 324/0.5 R |
| 3,886,439 | 5/1975 | Laukien | 324/0.5 R |

Primary Examiner—M. Tokar
Attorney, Agent, or Firm—Stanley Z. Cole; Edward H. Berkowitz

[57] ABSTRACT

The field-frequency lock system of an impulse NMR spectrometer operates in an automatic bidirectional search mode characterized by relatively low pulse repetition rate, and relatively high power excitation. Searching is accomplished by monitoring the frequency of an absorption mode lock signal with a bidirectional counter. The sense input of the bidirectional counter is derived from a phase comparison of the absorption mode signal with the concomitant dispersion mode signal. The resulting counter output is converted to analog form yielding a search mode control signal. Transitions in the sign of the phase comparison signal initiate a transition to the relatively low power, high repetition rate excitation of the lock mode. In the search mode, facility is provided to maintain the control signal output although certain transient conditions may reduce the amplitude of the lock signal below minimum levels for operation.

16 Claims, 5 Drawing Figures

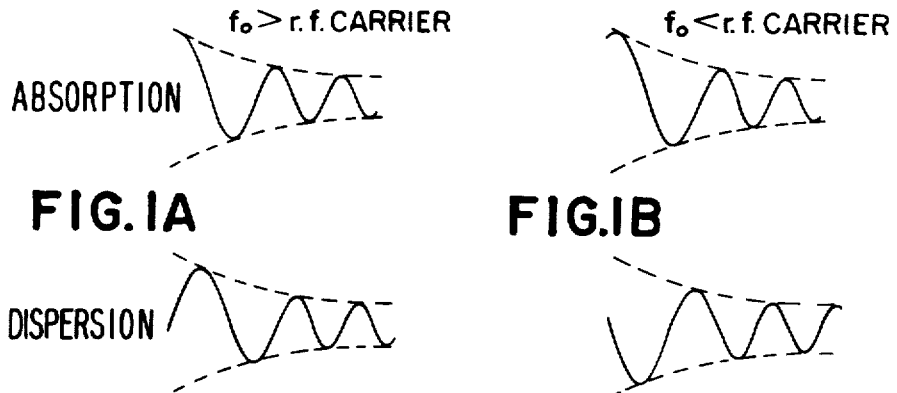
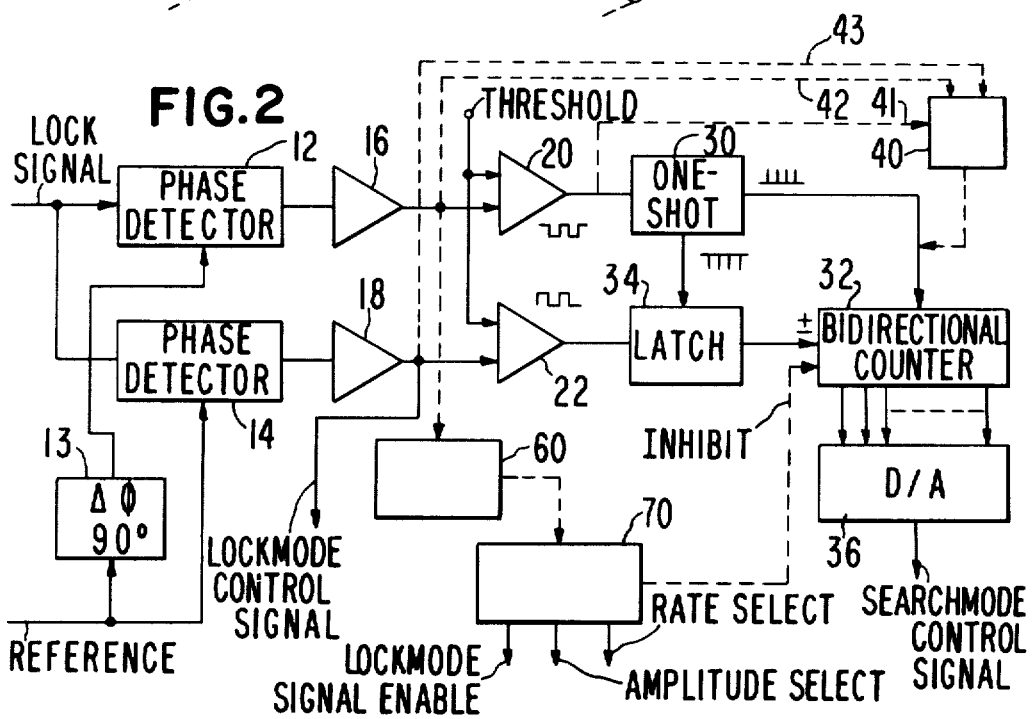
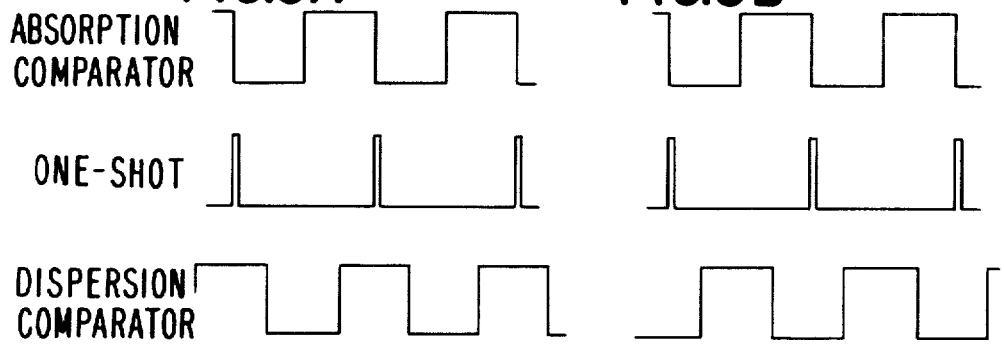

AUTOMATIC FIELD-FREQUENCY LOCK IN AN NMR SPECTROMETER

STATEMENT OF THE INVENTION

The present invention is generally related to impulse gyromagnetic resonance spectrometers and more particularly to method and apparatus to automatically accomplish and maintain a desired field-frequency relationship for such spectrometers.

DESCRIPTION OF THE PRIOR ART

Modern NMR spectroscopy imposes a stability requirement upon the relationship of magnetic (polarizing) field and the frequency of the rf excitation. This constraint is achieved by means of field-frequency lock apparatus which ordinarily takes the form of a separate information channel deriving an NMR signal which is (at least to some degree) independent of the signal of the analysis channel.

Two general classes of field frequency lock schemes may be distinguished. In the continuous wave (CW) mode, the magnetic field is modulated at audio frequencies as with auxiliary modulation coils, or the rf energy may be pulse modulated; in either instance, the control signal for the lock is derived from the dc dispersion mode response. Such a lock is characterized by a stable field-frequency relationship and in the presence of high signal-to-noise conditions and relatively small driving voltage the capture range can be rather wide.

The second general approach to field-frequency lock systems is employed for lower repetition rate rf pulses. In such systems the free induction decay (FID) is detected between rf pulses applied at rates of the order of 10 Hz. The Fourier decomposition of the rf pulses results in side band frequency components extending symmetrically over a wide band of frequencies. The capture range for this lock is rather narrow due to the off resonance oscillatory nature of the free induction decay signal. In the prior art the signal is displayed and the operator observes the frequency of this signal as the magnetic field is adjusted. Because this frequency is proportional to the offset of the carrier from resonance, the approach to resonance condition is marked by reduction in frequency of the displayed signal.

Lock channel receivers of the prior art operating in the CW mode typically employ quadrature phase detection which (for an appropriate choice of phase) results in a pure dispersion mode signal and a pure absorption mode signal. The latter signal is proportional to the peak amplitude of the NMR signal and is ordinarily taken as a measure of field homgeneity. The dispersion mode signal which is a null at resonance provides a control signal for the lock system.

In the low pulse repetition rate mode, the two signals differ in phase by 90°, the sign of the phase difference indicating the direction for correction and the frequency difference measuring the magnitude of frequency offset of the rf carrier from resonance. Thus, the operator is instructed by appropriate displays for initialization of a lock by manual search.

It is an object of the present invention to provide field-frequency control apparatus for an impulse gyromagnetic spectrometer which will automatically initialize and maintain the field frequency relationship.

One feature of the present invention is the provision in an impulse gyromagnetic spectrometer of a bidirectional counter deriving a frequency input from a first output of a quadrature phase detector responsive to the lock channel FID signal and a sense input derived from a comparison of the first and second outputs of the quadrature phase detector of the lock channel of said spectrometer.

In another feature of the invention, a field-frequency search mode control signal is derived from a digital to analog converter operative upon the content of said bidirectional counter.

In an alternative feature of the invention, a transition in the sense signal input of said bidirectional counter causes the field-frequency control apparatus to enter the lock mode wherein the field-frequency regulation signal derives directly from the second output of the quadrature phase detector signal to form a lock mode control signal.

In another feature of the invention, detection of the onset of resonance by an integration of the first phase output causes the field frequency control apparatus to enter the lock mode wherein the field frequency regulation signal is derived directly from the second output of the quadrature phase detector to form a lock mode control signal.

In yet another feature of the invention, the pulse amplitude is maintained relatively high and the pulse repetition rate relatively low when the search mode control signal regulates the field frequency relationship and the pulse amplitude is maintained relatively low and the pulse repetition rate relatively high when the lock mode control signal regulates the field frequency relationship.

In yet another feature of the invention, provision is made to return the regulation of the field-frequency relationship to the search mode if the lock mode fails to yield resonance signals within a prescribed interim after transition from search mode to lock mode.

These and other objects and advantages of the present invention will become apparent from the following description of a preferred embodiment of the invention illustrated in the accompanying drawings wherein:

BRIEF SUMMARY OF THE DRAWINGS

FIGS. 1A and B show the relationship of absorption to dispersion mode signals for pulse carrier frequencies below (A) and above (B) resonance.

FIG. 2 is a block diagram for the search mode control signal generation apparatus of a preferred embodiment of the present invention.

FIG. 3 shows the signals of FIG. 1 after transformation to square wave form by the apparatus of FIG. 2.

DETAILED DESCRIPTION OF THE INVENTION

Turning now to FIG. 1 the relative phases of FID signals from each output of a quadrature phase detector are shown for the cases where the pulse carrier frequency is respectively higher and lower than $f_o$, the resonant frequency. For convenience, in the following discussion the quadrature phase resolved free induction signals will be referenced as absorption and dispersion mode signals although it will be understood that such particular choice of phase is not a requirement of the invention. Relative to the absorption mode signal, the dispersion mode signal is, in the two cases, respectively either retarded or advanced by 90°. The frequency characterizing the signals is, as discussed above, proportional to the offset of carrier frequency from resonance.

FIG. 2 is a basic block diagram of the preferred embodiment for a circuit to develop a search mode control signal after the teaching of the invention. A lock signal from the receiver of an NMR spectrometer (not shown) is compared in phase detector 12 with a 90° phase shifted reference signal derived from the transmitter through phase shifter 13. The output of phase detector 12 is input to amplifier 16 and thence, converted to square wave images of the lock signal corresponding to the absorption mode NMR response. For this purpose a comparator 20 is used to compare the input signal with a small threshold level adjusted to slightly exceed the noise level. Pulses produced from the comparator 20 are square wave images of uniform amplitude corresponding, for example, to the positive half waves of the absorption mode NMR signal as derived from phase detector 12; that is, the positive input signal yields positive square wave signals and zero or negative input signals give zero output signals.

Parallel to the above processing sub-channel, another processing subchannel comprises phase detector 14, operative upon the lock signal and the unshifted reference signal to produce a dispersion mode signal. Amplifier 18 provides sufficient amplitude for the processing in comparator 22 similar to comparator 20.

To facilitate phase comparison of the outputs of the comparators 20 and 22, comparator 20 is next fed to one-shot 30 to produce uniform phase marking pulses. The latter pulses are produced by one-shot 30 at the positive-to-negative going transition of the absorption mode signal. Turning now to FIG. 3 the timing relationships are shown for the outputs of comparator 20 (the absorption mode signal), its associated phase marking signal output from one-shot 30 and comparator 22 (the dispersion mode signal) under respective conditions of rf carrier too low and too high compared to resonance. At the point in the absorption mode signal period marked by the one-shot outputs the dispersion mode square wave is high when the rf carrier is lower than resonance and low when the rf carrier frequency is above the resonant frequency.

Returning to FIG. 2, the pulse output of one-shot 30 is employed for two purposes. First it is input to bidirectional counter 32 for frequency counting purposes. The one-shot also is employed to latch the state of dispersion mode comparator output via latch 34. In the example of FIG. 3 this state is positive if the rf carrier frequency is lower than resonance and negative if the rf carries frequency is above resonance. Latch 34 therefore produces an output dependent upon the state of the dispersion mode comparator 22 in relationship to the phase of absorption mode comparator 20 and this output in turn controls the sense of bidirectional counter 32.

The digital output of counter 34 is then converted to form an analog control signal by digital-to-analog converter 36. This signal may be employed in known fashion to control, for example, the polarizing field of the spectrometer in relationship to the rf carrier frequency.

The effect of very narrow high amplitude pulses for NMR excitation as employed here, has been treated by Freeman and Hill (J. Mag. Res. 4, p. 366 (1971)). There it is shown that when the interval between such pulses is comparable with, or shorter than the relevant relaxation times, as is the case in the present apparatus, the response will exhibit large variations in amplitude and phase. The present apparatus is insensitive to absolute phase; only the phase difference between the phase detector signals is relevant and this difference depends on the sign of the offset frequency in relation to the resonant frequency. A variation in amplitude could conceivably cause the signals from each detector to fall below the comparator threshold thereby halting the action of the circuit. This may occur at periodic intervals in the offset frequency when the offset frequency is a multiple of the pulse repetition frequency under which condition the resonance is effectively saturated. Under such a condition, there is a drop in amplitude which may be sufficient to cause loss of signal at the phase detectors 12 and 14.

In order to maintain a search mode control signal under loss of signal, a logic module 40 including a pulse source permits a number of pulses, n (for example, 1 to 10 pulses), to be gated at rates of order 100 Hz. to the bidirectional counter 32 if the signal input to comparator 20 is less than the threshold value. For the choice of phases of FIG. 1, it is sufficient for logic circuit 40 to inhibit its pulse output in response to an appropriately time-averaged sample from the output of comparator 20 derived on signal input 41. Upon recovery of the NMR signal, or the occurence of n such artifically supplied pulses, the artificially supplied pulses are gated off. This provides additional pulses to the counter 32 only during the interval between the rf pulse and the first negative going transition of the absorption mode signal. Any loss of NMR signal will gate pulses to the counter 32 for a selected number of rf periods or until an NMR signal is excited. In these instances, the previously established direction of the bidirectional counter is preserved by latch 34.

In order to switch from the low repetition rate search mode to a high repetition rate lock mode, it is necessary to develop a signal indicative of the proximity of the resonant condition, e.g., that the field-frequency relationship has passed through resonance. In response to such a resonance proximity signal, logic signals are developed to reduce the excitation amplitude, which amplitude is set very high for the search mode. In this usage, a high amplitude is large in relation to saturating effects at resonance. It is ordinarily preferable to maintain field frequency lock conditions close to resonance by switching to the CW mode in order to eliminate low frequency instabilities. This is easily accomplished by inhibiting all inputs to the counter 32 and deriving the control signal directly from the dispersion mode phase detector through a low pass filter. This aspect of the apparatus is well known and not shown. In the preferred embodiment, an integrated sample of the absorption mode signal is compared to a threshold in logic subunit 60 to provide such a signal. In an alternative embodiment, the latch signal may be monitored for any transition which would indicate passage through the resonance peak.

Logic subunit 60 develops a signal to provide automatic return to the search mode. In the lock mode, the absorption mode signal is compared against a predetermined threshold to maintain the low power high frequency pulse mode. If the output of the phase detector 12 is below the selected threshold, logic subunit 60 provides for reversion to the high power lower petition rate search mode.

Mode switching control 70 accomplishes the indicated transitions between search and lock modes. Thus, the pulse repetition rate is selected as high or low, the amplitude low or high, the bidirectional counter enabled or inhibited and the lock mode signal enabled in accord with the indicated onset of resonance to form the desired error signal for field regulation. Additionally, a delay is provided for transitions from the search mode to the lock mode in order to permit nuclei to recover from saturation encountered during the search mode. Typically, such a delay period is of the order of a few seconds, and if lock is not established by the end of that period, the system will revert again to the search mode. Since incorrect phasing and/or incorrect power level in the search (low power) mode could prevent a stable lock, manual controls are provided for lock channel phase and for low power rf level to allow for different probe tuning and lock sample conditions.

Logic subunits 40, 60 and 70 are assembled from conventional electronic logic components in straight forward fashion and are not discussed in greater detail.

In a minor variation of the apparatus described, the bandwidth of phase detector 12 may be restricted to improve the signal to noise conditions. As a result, the capture range will then be substantially constrained; however, the logic module 40 is then defined to continuously supply pulses to counter 32 thereby providing a ramp signal for search purposes. The detection of a free induction signal is then employed to inhibit further pulses from module 40 and to control the sweep rate and direction as previously described to achieve the exact resonance condition.

The logic implemented by the module 40 may be further generalized to comport with the case of arbitrary choice of phase (other than that of FIG. 1A and B). It is necessary to inhibit the pulse output of module 40 when the resonance condition is obtained. This is indicated whenever at least one of the two signal outputs of the quadrature phase detector takes on a DC non-zero value, time-averaged over a period longer than the pulse repetition period. Thus, the signal from amplifiers 16 and 18 are sampled by signal inputs 42 and 43 respectively for the required analysis.

For the arbitrary phase case, it is not necessary to provide a separate lock mode control signal nor to inhibit counter 34; logic subunit 70 need only provide pulse rate and amplitude selection in response to the onset of resonance detected by subunit 60.

Any alterations and modifications of the instant invention will be apparent to those of skill in the art from the foregoing description and it is understood that this description is for purposed of illustration only and is not intended to be limiting in any way and that it is intended that dependent claims be interpreted as covering all modifications which fall within the spirit and scope of the invention.

What is claimed is:

1. In an impulse NMR spectrometer comprising lock channel excitation means, for exciting resonance in a sample, field-frequency lock error signal responsive means for maintaining a desired field-frequency relationship, said spectrometer including quadrature phase detection means for phase resolving free induction decay signals, the improvement comprising:
    a bidirectional counter responsive to the frequency of a first phase resolved signal and means for comparing the phase of said quadrature free induction signals to derive a binary output indicative of the sign of said phase difference;
    the sense input of said bidirectional counter responsive to said binary phase difference signal;
    digital-to-analog conversion means operative upon the output of said bidirectional counter for developing a search mode analog signal in response to the digital content of said counter for correction of the field-frequency relationship in said spectrometer by said error signal responsive means.

2. The apparatus of claim 1 wherein said quadrature phase detection means yields said first phase resolved signal in the absorption mode and a second phase resolved signal in the dispersion mode.

3. The apparatus of claim 2 including means for generating a lock mode analog signal in response to said dispersion signal for correction of field-frequency relationships in said spectrometer.

4. The apparatus of claim 3 comprising means responsive to the onset of resonance for enabling said error signal responsive means to respond to said lock mode signal when proximity to resonance is indicated by a transition in said binary output indicative of the sign of said phase difference.

5. The apparatus of claim 4 comprising means for inhibiting said lock mode signal whereby said error signal responsive means is active in accord with said search mode signal if said resonance is not attained by said error signal responsive means within a prescribed interval following detection of the onset of resonance.

6. The apparatus of claim 5 wherein said excitation means for exciting said sample in said search mode generates pulses having a repetition rate which is low in comparison with the relaxation time of said sample and an amplitude which is high compared to saturation producing pulse amplitude at resonance.

7. The apparatus of claim 5 wherein the detection of the onset of resonance causes the excitation means to excite said samples with pulses characterized by a repetition rate which is high in comparison with the relaxation time of said sample and amplitude which is low in relation to saturation producing pulse amplitude at resonance.

8. The apparatus of claim 1 comprising means to supply pulser pulses to said bidirectional counter at a selected repetition rate whenever said first phase resolved signal is lower than a selected threshold.

9. The apparatus of claim 8 further comprising means to detect the resonant condition whereby said pulser pulses are inhibited during continuance of said resonant condition.

10. In an impulse NMR spectrometer having a field-frequency lock channel for exciting resonances in a reference sample resulting in a lock channel free induction decay signal to provide a reference for the relationship of RF carrier frequency to polarizing magnetic field, the method of stablizing said relationship comprising the steps of:
    exciting the sample with pulses of said RF energy characterized by a low repetition rate compared to the relaxation time of such sample,
    phase resolving the free induction decay signal to provide two quadrature related phase components of said signal,
    deriving from a first of said quadrature related signals a signal responsive to the magnitude of frequency offset for said RF carrier frequency from the resonance of said sample,
    comparing the phases of said phase resolved signals to determine the sign of the phase of the second said quadrature related signal compared to the phase of said first phase resolved signal,
    establishing an error signal having a magnitude proportional to said frequency offset and said error signal having a polarity determined by said sign of said phase comparison signal.

11. The method of claim 10 comprising selecting the phase of said first quadrature related signals to correspond to the absorption mode component of said free induction decay signals and the other of said quadrature related signals to correspond to the dispersion mode component of said free induction decay signal.

12. The method of claim 11 further comprising:
establishing that said field frequency relationship is in proximity to resonant condition.

13. The method of claim 12 further comprising:
changing the pulse repetition rate to a high value compared to the relaxation time of said sample,
establishing a lock-mode control signal from said dispersion mod signal, and
deriving the error signal from said lock mode control signal.

14. The method of claim 13 further comprising:
reversing said changes if resonance is not established within a prescribed time.

15. The method of claim 14 wherein the low repetition rate excitation pulses are further characterized by sufficient power to produce saturation of the free induction decay signal at resonance.

16. The method of claim 15 wherein the change of said low repetition rate to a high repetition rate is accompanied by a reduction in the power content of said excitation to a level which will not produce saturation in the free induction decay signal at resonance.

* * * * *